United States Patent [19]
Seung-Ho

[11] Patent Number: 6,011,426
[45] Date of Patent: Jan. 4, 2000

[54] SUBSTRATE VOLTAGE GENERATION CIRCUIT FOR SEMICONDUCTOR DEVICE

[75] Inventor: Jung Seung-Ho, Choongcheongbuk-Do, Rep. of Korea

[73] Assignee: LG Semicon Co., Ltd., Choongcheongbuk-Do, Rep. of Korea

[21] Appl. No.: 08/933,001

[22] Filed: Sep. 18, 1997

[30] Foreign Application Priority Data

Apr. 16, 1997 [KR] Rep. of Korea ................ 97-13987

[51] Int. Cl.⁷ ................................................ G05F 1/10
[52] U.S. Cl. .......................... 327/536; 327/101; 327/113
[58] Field of Search .................................. 327/101, 113, 327/530, 534, 535, 536

[56] References Cited

U.S. PATENT DOCUMENTS 5,528,538   6/1996   Sakuta et al. .................. 365/189.09

Primary Examiner—Timothy P. Callahan
Assistant Examiner—Jeffrey Zweizig
Attorney, Agent, or Firm—Morgan, Lewis & Bockius LLP

[57] ABSTRACT

A substrate voltage generation circuit for a semiconductor device which is capable of decreasing the amount of current consumed by a charge pump. The circuit includes a burn-in detection unit for differently varying logical states of output signals φ in a normal mode and a burn-in mode, respectively, a mode judgement unit for outputting first and second voltages in the normal mode and the burn-in mode in accordance with an output signal from the burn-in detection unit, an oscillation unit for outputting voltages OSCV having different oscillation frequencies in accordance with the first and second voltages, and a charge pump for pumping an output voltage OSCV from the oscillation unit and generating a substrate voltage.

6 Claims, 3 Drawing Sheets

SUBSTRATE VOLTAGE GENERATION CIRCUIT FOR SEMICONDUCTOR DEVICE

BACKGROUND OF THE INVENTION

1. Field of the Invention

The present invention relates to a substrate voltage generation circuit for a semiconductor device, and in particular to an improved substrate voltage generation circuit for a semiconductor device which is capable of increasing a substrate power supply capability and decreasing the amount of current consumed by a charge pump by pumping a word line driving voltage in a burn-in mode and adding a mode judgement circuit.

2. Description of the Conventional Art

FIG. 1 illustrates a conventional substrate voltage generation circuit for a semiconductor device, a conventional substrate voltage generation circuit for a semiconductor device includes an oscillation unit 1 for generating a voltage OSCV having a predetermined frequency, a first charge pump 2 for pumping an output voltage OSCV from the oscillation unit 1 and generating a substrate voltage VBB, a burn-in detection unit 3 for recognizing a burn-in mode and outputting a signal φ based on the recognized mode, and a second charge pump 4 for pumping the signal φ and generating a substrate voltage VBB.

The operation of a conventional substrate voltage generation circuit for a semiconductor device will now be explained with reference to the accompanying drawing.

The oscillation unit generates a voltage OSCV having a predetermined frequency. The first charge pump 2 pumps the voltage OSCV and generates a substrate voltage VBB, and the substrate voltage VBB is applied to a semiconductor device. At this time, the level of the output signal φ from the burn-in detection unit 3 is low.

In addition, when the normal mode is changed to the burn-in mode, the burn-in detection unit 3 outputs a high level output signal 100, and the second charge pump 4 pumps the output signal φ and outputs the same to the substrate voltage VBB.

The level of the substrate voltage VBB pumped by the second charge pump 2 is higher than the level of the substrate voltage VBB pumped by the first charge pump 2 in the normal mode.

In the burn-in mode, a high level substrate voltage VBB is generated by using an additional charge pump, so that it is possible to prevent characteristic degradation such as a latch-up, etc. which occurs due to the substrate voltage VBB in the burn-in mode.

However, in the conventional substrate voltage generation circuit for a semiconductor device, since the charge pump which is operated in the burn-in mode is additionally used, the amount of current which is used for two charge pumps is increased, and since two identical hardware are used, the efficiency of the circuit is deceased.

SUMMARY OF THE INVENTION

Accordingly, it is an object of the present invention to provide a substrate voltage generation circuit for a semiconductor device which overcomes the aforementioned problem encountered in the conventional art.

It is another object of the present invention to provide an improved substrate voltage generation circuit for a semiconductor device which is capable of decreasing the amount of current consumed by a charge pump.

To achieve the above objects, there is provided a substrate voltage generation circuit for a semiconductor device which includes a burn-in detection unit for differently varying logical states of output signals φ in a normal mode and a burn-in mode, respectively, a mode judgement unit for outputting first and second voltages in the normal mode and the burn-in mode in accordance with an output signal from the burn-in detection unit, an oscillation unit for outputting voltages OSCV having different oscillation frequencies in accordance with the first and second voltages, and a charge pump for pumping an output voltage OSCV from the oscillation unit and generating a substrate voltage.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
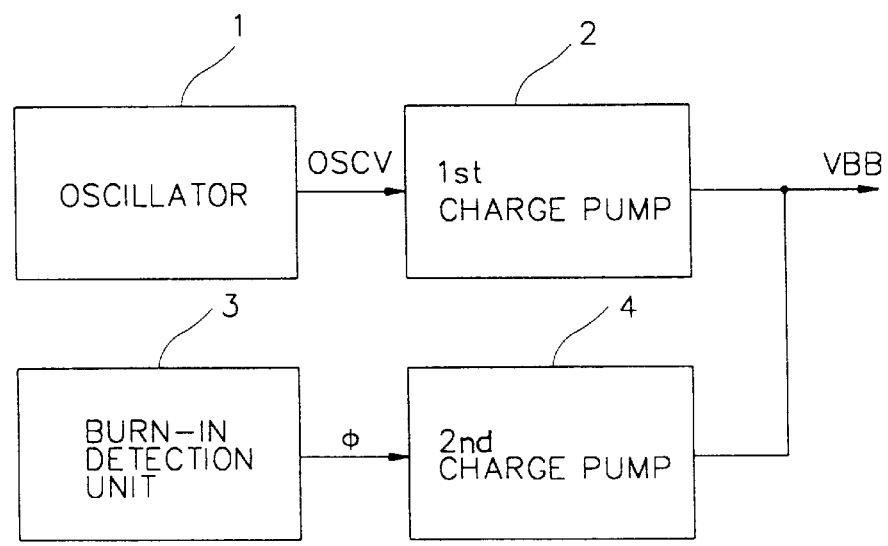
FIG. 1 is a block diagram illustrating a conventional substrate voltage generation circuit for a semiconductor device.
Figure 2:
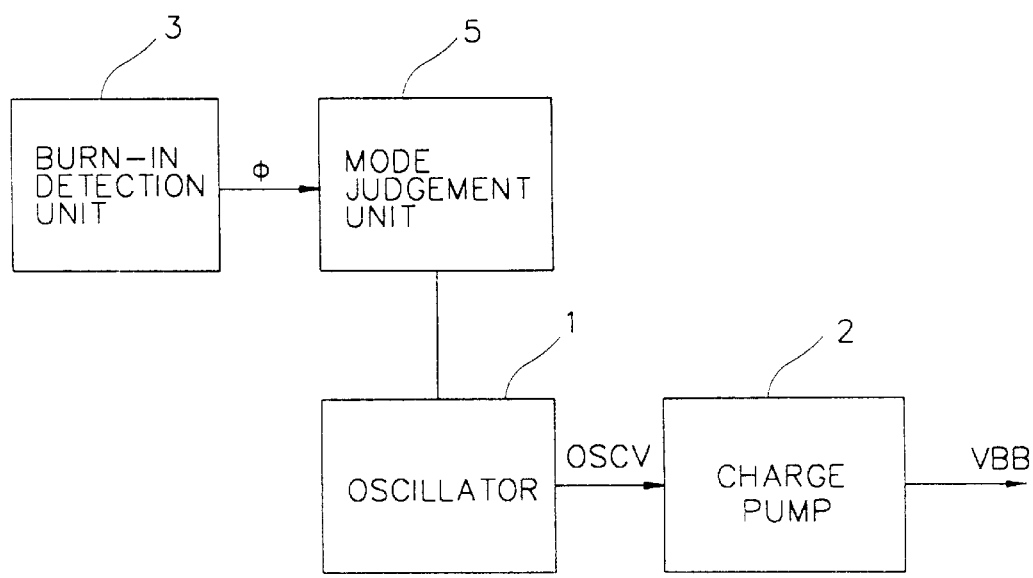
FIG. 2 is a block diagram illustrating a substrate voltage generation circuit for a semiconductor device according to the present invention.

FIG. 2 illustrates a substrate voltage generation circuit for a semiconductor device according to the present invention.

As shown therein, the substrate voltage generation circuit for a semiconductor device according to the present invention includes a burn-in detection unit 3 for differently changing a logical state of an output signal φ in a normal mode and a burn-in mode, a mode judgement unit 5 for outputting a first voltage when the output signal φ is a low level and outputting a second voltage when the same is a high level, an oscillation unit 1 for outputting voltages OSCV having different oscillation frequencies in accordance with an output voltage from the mode judgement unit 5, and a charge pump 2 for pumping the output voltage OSCV from the oscillation unit 1 and generating a substrate voltage VBB. The first voltage is a voltage VCL used in a peripheral circuit, and the second voltage is used for a word line driving voltage VCH.

Figure 3:
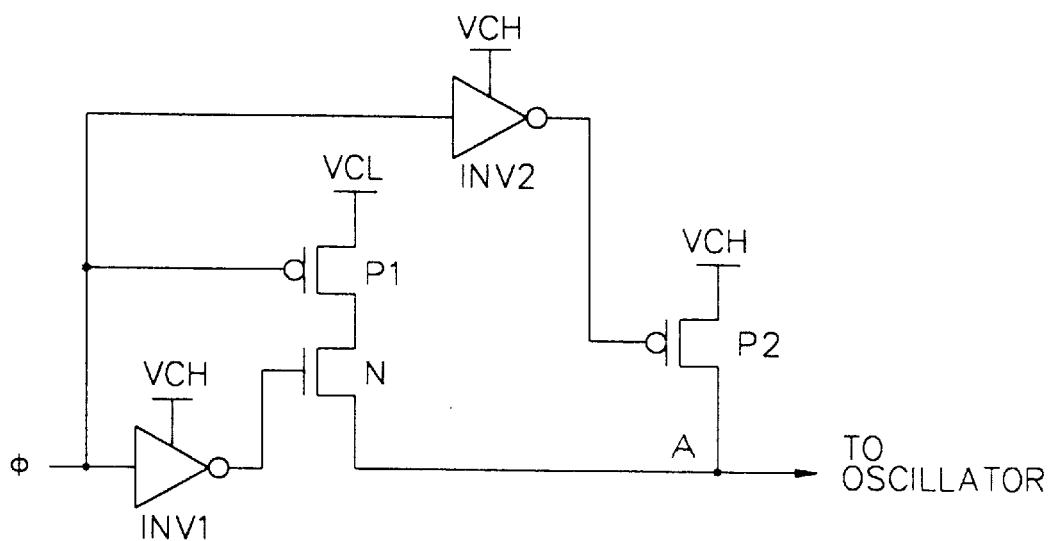
FIG. 3 is a detailed circuit diagram illustrating a mode judgement unit in the circuit of FIG. 2 according to the present invention.

In addition, FIG. 3 illustrates a mode judgement unit in the circuit of FIG. 2 according to the present invention.

As shown therein, the mode judgement unit 5 includes first and second inverters INV1 and INV2 for outputting a word line driving voltage VCH when the output signal φ from the burn-in detection unit 3 is a low level and outputting a low level signal when the same is a high level, a first PMOS transistor P1 the gate of which includes the output signal φ and the source of which is connected to a voltage VCL, an NMOS transistor N the gate of which receives the output from the first inverter INV1, the drain of which is connected with the drain of the first PMOS transistor P1, and the source of which is connected to an output terminal A, and a second PMOS transistor P2 the gate of which receives the output from the second inverter INV2, the source of which is connected with a word line driving voltage VCH, and the drain of which is connected to the output terminal A.

The operation of the substrate voltage generation circuit for a semiconductor device according to the present invention in the normal mode and the burn-in mode will now be explained.

First, in the normal mode, the output signal φ from the burn-in detection unit 3 is a low level, and the mode judgement unit 5 and the first and second inverters INV1 and INV2 output a word line driving voltage VCH, respectively, and the first PMOS transistor P1 receives a low level output signal φ through the gate of the same and is turned on.

The NMOS transistor N connected in series with the first PMOS transistor P1 is turned on by the voltage VCH from the first inverter INV1, and the voltage VCL which is used in the peripheral circuit is outputted through an output terminal A.

Figure 4:
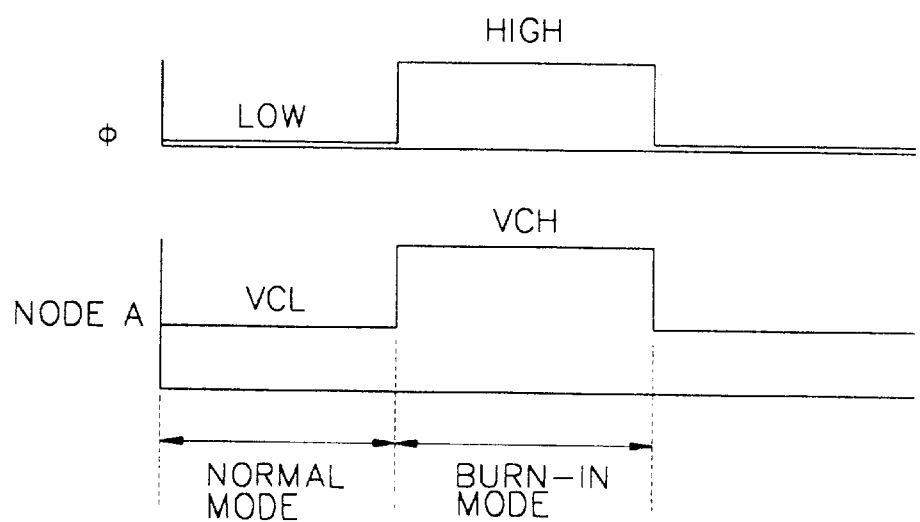
FIG. 4 is a waveform diagram of a signal from an element in the circuit of FIG. 3.

FIG. 4 is a waveform diagram of a signal from an element in the circuit of FIG. 3.

In addition, the voltage VCH from the second inverter INV2 is supplied to the gate of the second PMOS transistor P2, and then the second PMOS transistor P2 is turned off.

Figure 5:
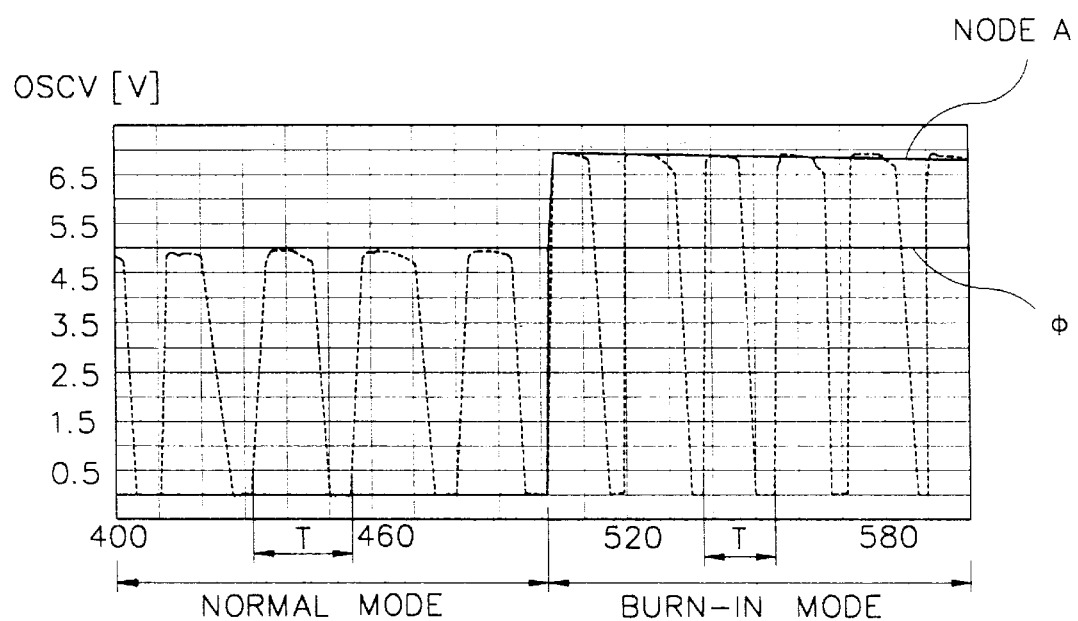
FIG. 5 is a waveform diagram of a signal from an oscillator unit.

The voltage VCL from the mode judgement unit 5 is inputted into the oscillation unit 1, and the oscillation frequency is determined by the size of the voltage VCL. FIG. 5 is a waveform diagram of a signal from an oscillator unit. The oscillation frequency is illustrated therein in accordance with the input voltage (VCL or VCH). As shown therein, when the voltage VCL is 5 V, the period of the oscillation frequency is about 24 ns.

The generated frequency OSCV is pumped by the charge pump 2 and is supplied to the substrate voltage VBB.

In the burn-in mode, the substrate voltage generation circuit for a semiconductor device will now be explained.

The operational mode is changed from the normal mode to the burn-in mode, the output signal φ from the burn-in detection unit 3 becomes a high level. Therefore, the outputs from the first and second inverters INV1 and INV2 of the mode judgement unit 5 become low levels, and the first PMOS transistor P1 is turned off.

The output from the second inverter INV2 is a low level, and then the second PMOS transistor P2 is turned on, and the voltage VCH is outputted through the output terminal A.

The voltage VCH is inputted into the oscillation unit 1, and as shown in FIG. 5, when the voltage VCH is 7 V, the period of the oscillation frequency is about 18 ns.

In addition, when the voltage VCL or a voltage lower than the level of the VCL is used without using the gate driving voltage of the NMOS transistor N as a voltage VCH, the level of the voltage VCL from the output terminal A is decreased due to the voltage drop of the NMOS transistor N.

As described above, in the substrate voltage generation circuit for a semiconductor device according to the present invention, the input levels from the oscillation unit are varied when the operation mode is changed from the normal mode to the burn-in mode. Therefore, in the normal mode, the voltage VCL which is used in the peripheral circuit is pumped, and in the burn-in mode, the word line driving voltage VCH is pumped. Therefore, the supply capability of the substrate voltage is increased and the consumption of current used in the charge pump is reduced by only providing a mode judgement circuit, without additionally providing a pumping circuit.

Although the preferred embodiment of the present invention has been disclosed for illustrative purposes, those skilled in the art will appreciate that various modifications, additions and substitutions are possible, without departing from the scope and spirit of the invention as recited in the accompanying claims.

What is claimed is:

1. A substrate voltage generation circuit for a semiconductor device, comprising:

a burn-in detection unit for differently varying logical states of an output signal φ in a normal mode and a burn-in mode, respectively;

a mode judgement unit for outputting first and second voltages in the normal mode and the burn-in mode in accordance with the output signal from the burn-in detection unit;

an oscillation unit for outputting an output voltage OSCV having different oscillation frequencies in accordance with the first and second voltages; and a charge pump for pumping the output voltage OSCV from the oscillation unit and generating a substrate voltage.

2. The circuit of claim 1, wherein said mode judgement unit outputs the first voltage when the output signal from the burn-in detection unit is a low level and the second voltage when the output signal from the burn-in detection unit is a high level.

3. The circuit of claim 1, wherein said first voltage is a voltage VCL used in a peripheral circuit, and said second voltage is a word line driving voltage VCH.

4. The circuit of claim 1, wherein said mode judgement unit includes:

first and second inverters for receiving the output signal from the burn-in detection unit;

a first PMOS transistor the gate of which receives the output signal from the burn-in detection unit, and the source of which is connected to the first voltage;

an NMOS transistor the gate of which receives an output from the first inverter, the drain of which is connected with the drain of the first PMOS transistor, and the source of which is connected with an output terminal connected to the oscillation unit; and a second PMOS transistor the gate of which receives an output from the second inverter, the source of which is connected to the second voltage, and the drain of which is connected to the output terminal.

5. The circuit of claim 1, wherein the output voltage OSCV has a period of oscillation corresponding to the second voltage which is shorter than a period of oscillation corresponding to the first voltage.

6. The circuit of claim 5, wherein the output voltage OSCV has a period of 24 ns when the first voltage is 5 V, and has a period of 18 ns when the second voltage is 7 V.

* * * * *